(12) United States Patent
Carr et al.

(10) Patent No.: US 10,886,376 B2
(45) Date of Patent: Jan. 5, 2021

(54) FORMATION OF WRAP-AROUND-CONTACT TO REDUCE CONTACT RESISTIVITY

(71) Applicant: INTERNATIONAL BUSINESS MACHINES CORPORATION, Armonk, NY (US)

(72) Inventors: Adra Carr, Albany, NY (US); Jingyun Zhang, Albany, NY (US); Choonghyun Lee, Rensselaer, NY (US); Takashi Ando, Tuckahoe, NY (US); Pouya Hashemi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/692,741

(22) Filed: Nov. 22, 2019

(65) Prior Publication Data

US 2020/0098927 A1      Mar. 26, 2020

Related U.S. Application Data

(63) Continuation of application No. 16/026,521, filed on Jul. 3, 2018.

(51) Int. Cl.
| | | |
|---|---|---|
| *H01L 29/417* | (2006.01) | |
| *H01L 29/786* | (2006.01) | |
| *H01L 21/768* | (2006.01) | |
| *H01L 21/285* | (2006.01) | |
| *H01L 29/06* | (2006.01) | |

(Continued)

(52) U.S. Cl.
CPC .. *H01L 29/41791* (2013.01); *H01L 21/28568* (2013.01); *H01L 21/76802* (2013.01);
(Continued)

(58) Field of Classification Search
CPC .......... H01L 29/78618; H01L 29/0673; H01L 29/41733; H01L 29/4175; H01L 29/41758;
(Continued)

(56) References Cited

U.S. PATENT DOCUMENTS

| | | |
|---|---|---|
| 6,441,435 B1 | 8/2002 | Chan |
| 9,159,794 B2 | 10/2015 | Yu et al. |

(Continued)

OTHER PUBLICATIONS

List of IBM Patents or Patent Applications Treated as Related dated Nov. 22, 2019, 2 pages.

(Continued)

*Primary Examiner* — Feifei Yeung Lopez
(74) *Attorney, Agent, or Firm* — Tutunjian & Bitetto, P.C.; Daniel P. Morris

(57) ABSTRACT

A method of forming a source/drain contact is provided. The method includes forming a sacrificial layer on a source/drain, and depositing an oxidation layer on the sacrificial layer. The method further includes heat treating the oxidation layer and the sacrificial layer to form a modified sacrificial layer. The method further includes forming a protective liner on the modified sacrificial layer, and depositing an interlayer dielectric layer on the protective liner. The method further includes forming a trench in the interlayer dielectric layer that exposes a portion of the protective liner.

20 Claims, 11 Drawing Sheets

(51) Int. Cl.
*H01L 29/423* (2006.01)
*H01L 29/45* (2006.01)

(52) U.S. Cl.
CPC .. *H01L 21/76805* (2013.01); *H01L 21/76864* (2013.01); *H01L 21/76865* (2013.01); *H01L 21/76888* (2013.01); *H01L 21/76895* (2013.01); *H01L 29/0673* (2013.01); *H01L 29/4175* (2013.01); *H01L 29/41733* (2013.01); *H01L 29/41758* (2013.01); *H01L 29/41766* (2013.01); *H01L 29/41783* (2013.01); *H01L 29/42392* (2013.01); *H01L 29/458* (2013.01); *H01L 29/78618* (2013.01); *H01L 29/78696* (2013.01)

(58) Field of Classification Search
CPC ......... H01L 29/41766; H01L 29/41783; H01L 29/41791; H01L 29/472392; H01L 29/458; H01L 29/78696; H01L 21/28568; H01L 21/76802; H01L 21/76864; H01L 211/76865; H01L 21/76888; H01L 21/76895
See application file for complete search history.

(56) References Cited

U.S. PATENT DOCUMENTS

| | | | |
|---|---|---|---|
| 9,318,581 B1 | 4/2016 | Guo et al. | |
| 9,397,197 B1 | 7/2016 | Guo et al. | |
| 9,406,804 B2 | 8/2016 | Huang et al. | |
| 9,805,989 B1 * | 10/2017 | Adusumilli | H01L 21/823878 |
| 9,847,390 B1 | 12/2017 | Xie et al. | |
| 2013/0092957 A1 * | 4/2013 | Sen | H01L 29/66515 |
| | | | 257/77 |
| 2013/0092988 A1 | 4/2013 | Uozumi | |
| 2013/0187228 A1 | 7/2013 | Xie et al. | |
| 2015/0255604 A1 | 9/2015 | Yang | |
| 2016/0148936 A1 | 5/2016 | Xu et al. | |
| 2017/0047411 A1 | 2/2017 | Cheng et al. | |
| 2017/0054003 A1 | 2/2017 | Liao et al. | |
| 2017/0207095 A1 * | 7/2017 | Lee | H01L 21/28518 |
| 2018/0151683 A1 * | 5/2018 | Yeo | H01L 29/0847 |
| 2018/0190810 A1 * | 7/2018 | Li | H01L 29/785 |

OTHER PUBLICATIONS

Chew et al., "Ultralow Resistive Wrap Around Contact to Scaled FinFET Devices by using ALD-Ti Contact Metal", 2017 IEEE International Interconnect Technology Conference. May 16-18, 2017. pp. 1-3.

Disclosed Anonymously, "A Structure for Forming a Contact with Improved Contact Resistance and Overlay Tolerance", IP.com Prior Art Database Technical Disclosure. IP.com No. 000226568. Apr. 16, 2013. pp. 1-5.

Loubet et al., "Stacked Nanosheet Gate-All-Around Transistor to Enable Scaling Beyond FinFET", 2017 Symposium on VLSI Technology Digest of Technical Papers. Jun. 5-8, 2017. pp. T230-T231.

* cited by examiner

FORMATION OF WRAP-AROUND-CONTACT TO REDUCE CONTACT RESISTIVITY

BACKGROUND

Technical Field

The present invention generally relates to complementary metal-oxide-semiconductor (CMOS) devices, and more particularly to the source/drain contacts of CMOS devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a source/drain contact is provided. The method includes forming a sacrificial layer on a source/drain, and depositing an oxidation layer on the sacrificial layer. The method further includes heat treating the oxidation layer and the sacrificial layer to form a modified sacrificial layer. The method further includes forming a protective liner on the modified sacrificial layer, and depositing an interlayer dielectric layer on the protective liner. The method further includes forming a trench in the interlayer dielectric layer that exposes a portion of the protective liner.

In accordance with another embodiment of the present invention, a method of forming a source/drain contact is provided. The method includes forming a sacrificial layer on a source/drain, wherein the sacrificial layer is silicon-germanium (SiGe), and depositing an oxidation layer on the sacrificial layer, wherein the oxidation layer is germanium dioxide ($GeO_2$). The method further includes heat treating the oxidation layer and the sacrificial layer to form a modified sacrificial layer, wherein the modified sacrificial layer is silicon dioxide ($SiO_2$). The method further includes forming a protective liner on the modified sacrificial layer, and depositing an interlayer dielectric layer on the protective liner. The method further includes removing a portion of the interlayer dielectric layer to form a trench that exposes a portion of the protective liner.

In accordance with yet another embodiment of the present invention, a field effect transistor is provided. The field effect transistor includes a gate structure on a substrate, a source/drain on opposite sides of the gate structure and on the substrate, and a source/drain contact on each of the source/drains, wherein each of the source/drain contacts wraps around the sides of source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a wrap-around contact to the source/drains to reduce the contact resistance. The wrap-around source/drain contacts can avoid the thermal stability concerns of having germanium sacrificial capping layers.

Embodiments of the present invention provide a method of forming wrap-around contacts on source/drains. A sacrificial layer that can later be selectively removed can be formed on the source/drains. The sacrificial layer can be silicon-germanium that can be converted to silicon oxide. A channel can be formed around each of the source/drains to increase the contact area, and a conductive contact material introduced into the channels, so a source/drain contact can be formed around each of the source/drains to increase the physical and electrical contact area.

Embodiments of the present invention provide source/drain contacts with a resistivity below $3 \times 10^{-9}$ Ohm/cm$^2$, and an increased contact-to-source/drain area. The source/drain contacts are not formed only on the top surface of the source/drains. Forming thicker silicide wrap-around contacts can reduce or avoid current flowing only through an area at the top of the source/drain contacts.

Exemplary applications/uses to which the present invention can be applied include, but are not limited to: horizontal transport fin field effect transistor (HT FinFET) devices, vertical transport fin field effect transistor (VT FinFET) device, transistor logic devices (e.g., NAND gates, NOR gates, XOR gates), flip-flops, memory devices (e.g., dynamic random access memory (DRAM), static random access memory (SRAM), etc.

It is to be understood that aspects of the present invention will be described in terms of a given illustrative architecture; however, other architectures, structures, substrate materials and process features and steps can be varied within the scope of aspects of the present invention.

Figure 1:
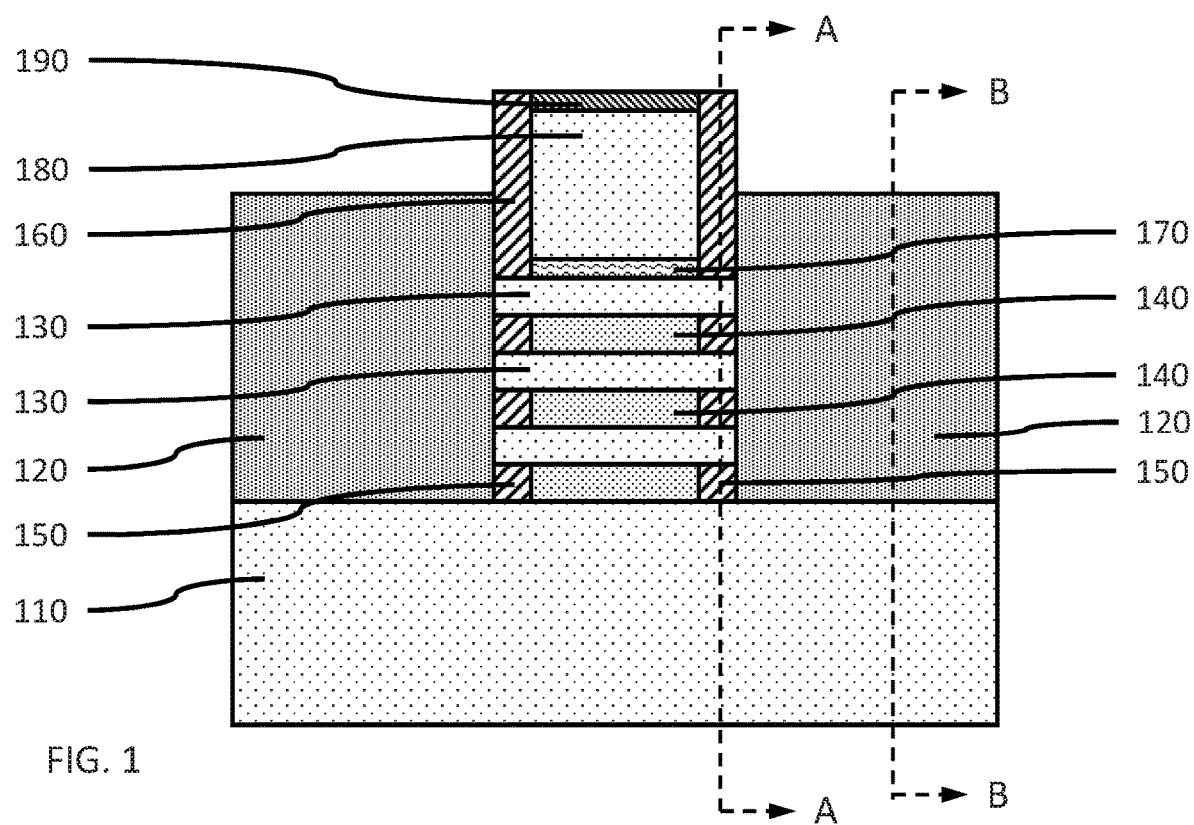
FIG. 1 is a cross-sectional side view showing the source/drains, channel layers, and dummy gate structure of a field effect transistor device, in accordance with an embodiment of the present invention.

Referring now to the drawings in which like numerals represent the same or similar elements and initially to FIG. 1, a cross-sectional side view of source/drains, channel layers, and dummy gate structure of a field effect transistor device is shown, in accordance with an embodiment of the present invention.

In various embodiments, a field effect transistor device can be formed on a substrate 110, where the field effect transistor device can include channel layers 130 and spacer layers 140 on the substrate 110. The channel layers 130 and spacer layers 140 can alternate, such that the spacer layers 140 separate the channel layers 130. Inner spacers 150 can be on opposite ends of each spacer layer 140, where the inner spacers 150 can be bars of a dielectric material (e.g., silicon oxide (SiO), silicon nitride (SiN), silicon oxynitride (SiON), etc.) that physically separates and electrically isolates the spacers layers from the source/drains on opposite sides of a gate structure. The device can be a fin field effect transistor device having a gate-all-around structure.

In various embodiments, the channel layers 130 can be silicon (Si) and spacer layers 140 can be silicon-germanium (SiGe). The substrate 110 can be a semiconductor wafer or a semiconductor-on-insulator (SeOI) structure, for example, a silicon-on-insulator (SOI) structure.

Source/drains 120 can be formed on the surface of the substrate 110 and the channel layers 130, where the source/drains can be in physical and electrical contact with the channel layers. The source/drains 120 can be formed by epitaxial growth on the exposed end-faces of the channel layers 130, where the source/drains 120 can be boron doped silicon germanium (SiGe) to form a p-type field effect transistor or phosphorus (P) doped silicon (Si) to form an n-type field effect transistor. The inner spacers 150 can prevent epitaxial growth from occurring on the end-faces of the spacer layers 140.

In various embodiments, a dummy gate structure, including, gate sidewall spacers 160, and a dummy gate insulator layer 170 and a dummy gate fill layer 180 within the gate sidewall spacers 160, can be formed on a portion of the stack of channel layers 130 and spacer layers 140. The dummy gate insulator layer 170 can be an oxide, for example, silicon oxide (SiO), and the gate sidewall spacers 160 can be a dielectric material, for example, silicon nitride (SiN), where the dummy gate insulator layer 170 can be selectively removed. The dummy gate fill layer 180 can be a sacrificial material, for example, amorphous silicon (a-Si) or amorphous carbon (a-C). A dummy cap 190 can be on the dummy gate fill layer 180 to protect the dummy gate fill layer during processing. The dummy cap 190 can be a dielectric material different from the gate sidewall spacers 160, for example, silicon carbonitride (SiCN).

The gate sidewall spacers 160 can extend around three sides of the stack of channel layers 130 and spacer layers 140 down to the substrate surface. The channel layers 130 and spacer layers 140 can be vertically aligned with the dummy gate structure, where the end-faces of the channel layers can be aligned with the outside surface of the gate sidewall spacers 160.

Figure 2:
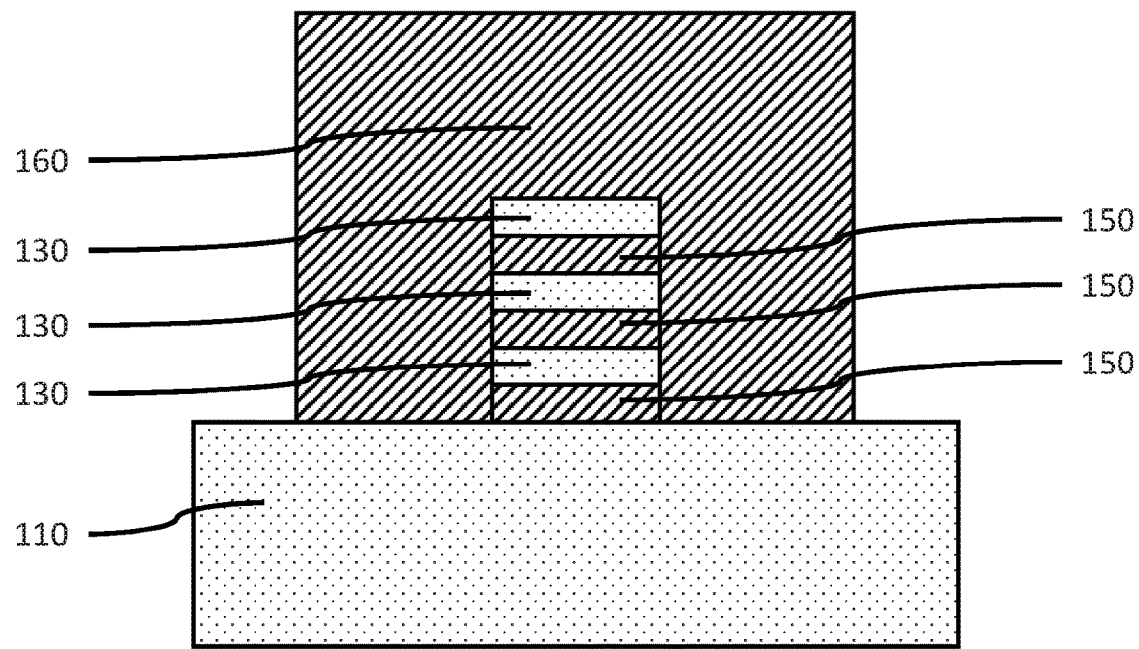
FIG. 2 is an A-A cross-sectional view of FIG. 1 showing the substrate, channel layers, inner spacers, and gate sidewall spacer of the field effect transistor device, in accordance with an embodiment of the present invention.

FIG. 2 is an A-A cross-sectional end view of FIG. 1 showing the substrate, channel layers, inner spacers, and gate sidewall spacer of the field effect transistor device, in accordance with an embodiment of the present invention.

The source/drains 120 can extend outward from the end-faces of the stack of channel layers 130, where the source/drains 120 can form a polygonal shape due to the epitaxial growth process. In various embodiments, the source/drains 120 can be silicon-germanium (SiGe) having a germanium concentration in a range of about 20 atomic percent (at. %) to about 70 at. %, or about 20 atomic percent (at. %) to about 60 at. %, or in a range of about 30 at. % to about 70 at. %, although other concentrations are also contemplated.

Figure 3:
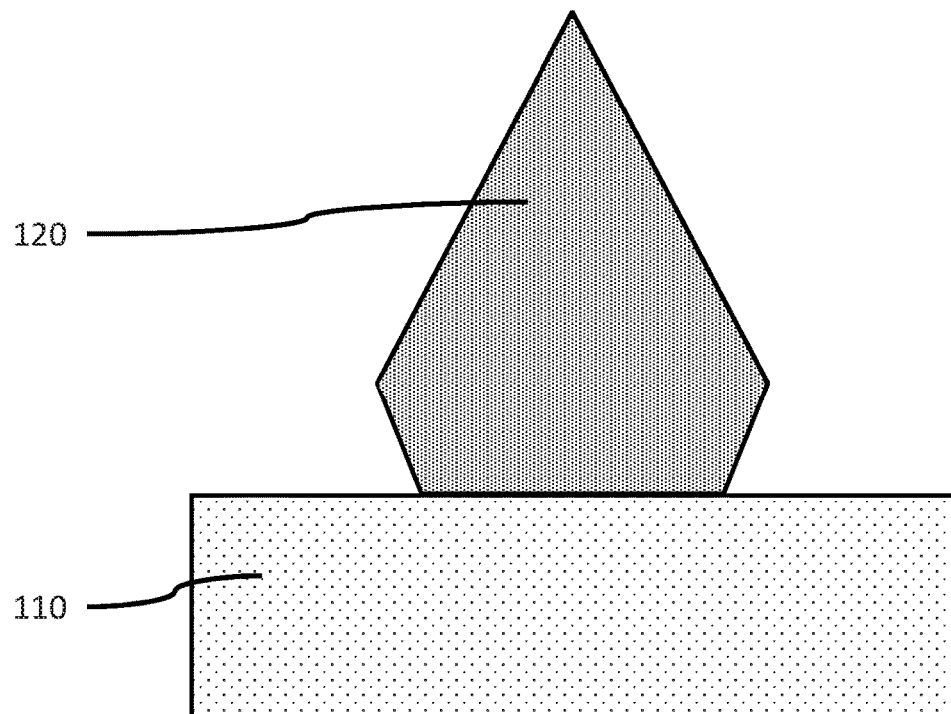
FIG. 3 is a B-B cross-sectional view of FIG. 1 showing a source/drain formed on the surface of the substrate, in accordance with an embodiment of the present invention.

FIG. 3 is a B-B cross-sectional view of FIG. 1 showing a source/drain formed on the surface of the substrate, in accordance with an embodiment of the present invention.

In various embodiments, the source/drains 120 can be single crystal semiconductors with n-type or p-type dopants incorporated into the semiconductor material. The source/drains 120 can be on the substrate 110.

Figure 4:
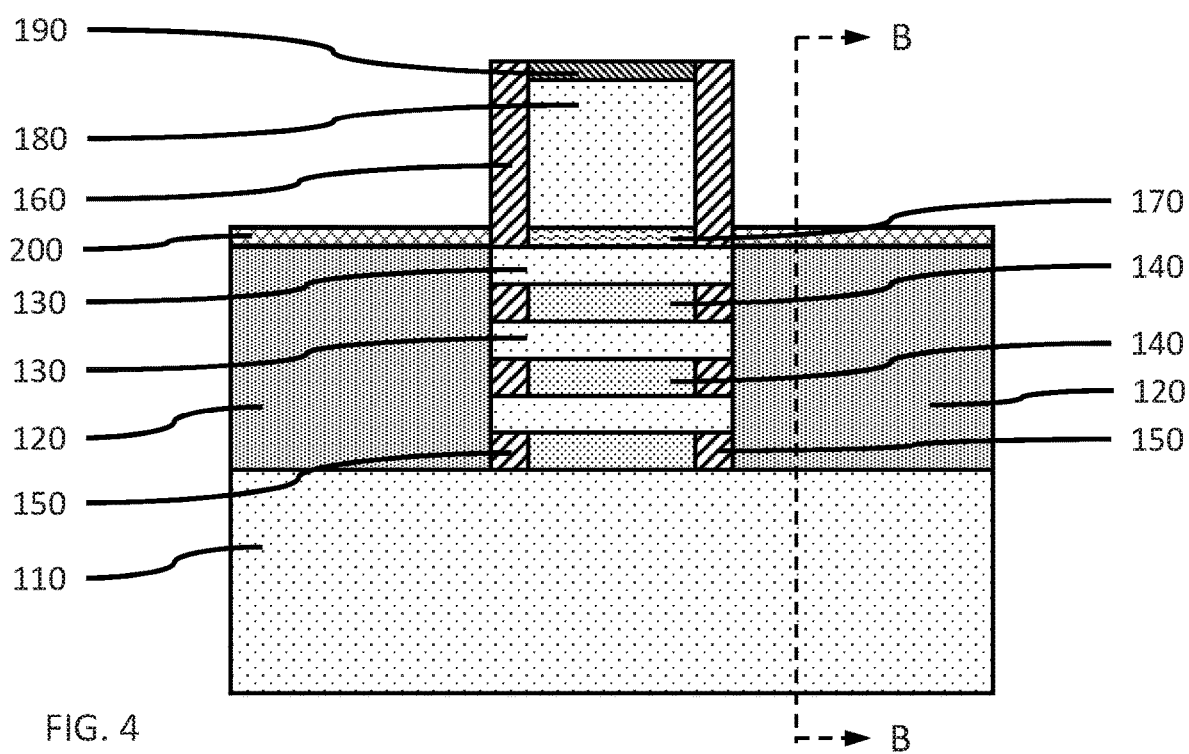
FIG. 4 is a cross-sectional side view showing a sacrificial layer on the source/drains, in accordance with an embodiment of the present invention.

FIG. 4 is a cross-sectional side view showing a sacrificial layer on the source/drains, in accordance with an embodiment of the present invention.

In various embodiments, a sacrificial layer 200 can be formed on the exposed surfaces of the source/drains 120, where the sacrificial layer 200 can be silicon-germanium having a different germanium concentration than the source/ drains 120. In various embodiments, the sacrificial layer 200 can be silicon-germanium (SiGe) having a germanium concentration in a range of about 20 atomic percent (at. %) to about 75 at. %, or about 20 atomic percent (at. %) to about 65 at. %, or in a range of about 30 at. % to about 75 at. %, although other concentrations are also contemplated.

In various embodiments, the sacrificial layer 200 can be formed by epitaxial growth on the surface of the source/drains 120, where the sacrificial layer 200 does not form on the dummy gate structure. The sacrificial layer 200 can cover the exposed surface of the source/drains 120 without forming on the surfaces of the gate sidewall spacers 160.

In various embodiments, the silicon-germanium (SiGe) source/drains 120 can have a sufficient germanium concentration that a separate silicon-germanium sacrificial layer 200 is not needed to subsequently form a modified sacrificial layer. A sacrificial layer 200 may be formed on n-doped silicon (Si) source/drains 120. The formation of a sacrificial layer 200 can be optional for a p-type source/drain.

Figure 5:
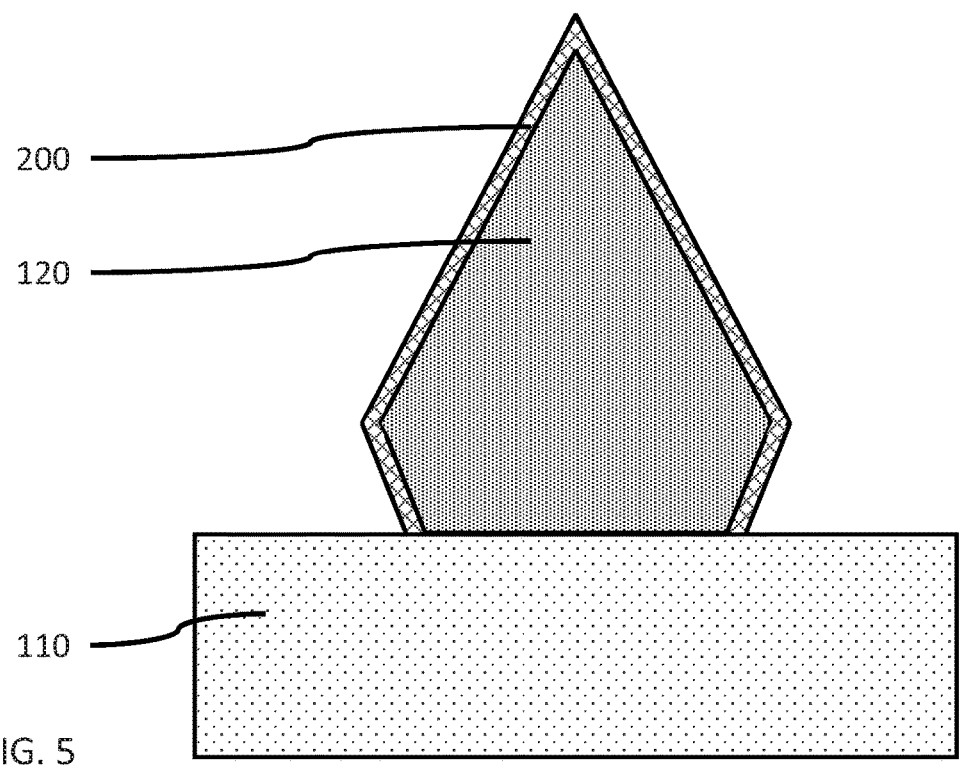
FIG. 5 is a B-B cross-sectional view of FIG. 4 showing the sacrificial layer on the source/drain, in accordance with an embodiment of the present invention.

FIG. 5 is a B-B cross-sectional view of FIG. 4 showing the sacrificial layer on the source/drain, in accordance with an embodiment of the present invention.

The sacrificial layer 200 can have a thickness in a range of about 1 nanometers (nm) to about 3 nm.

Figure 6:
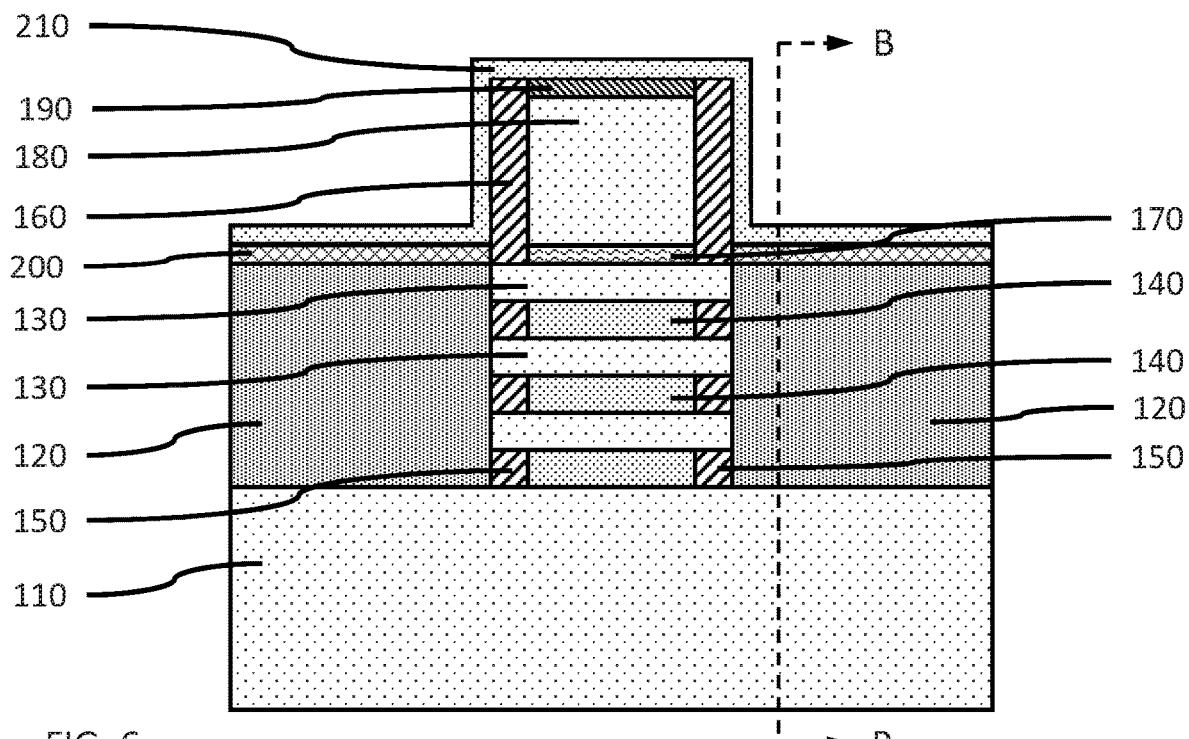
FIG. 6 is a cross-sectional side view showing an oxidation layer on the sacrificial layer and dummy gate structure, in accordance with an embodiment of the present invention.

FIG. 6 is a cross-sectional side view showing an oxidation layer on the sacrificial layer and dummy gate structure, in accordance with an embodiment of the present invention.

In various embodiments, an oxidation layer 210 can be formed on the sacrificial layer 200, gate sidewall spacers 160 and dummy gate cap 190 of dummy gate structure. The oxidation layer 210 can be formed by a conformal deposition, for example, atomic layer deposition (ALD), plasma enhanced ALD (PEALD), and combinations thereof. The oxidation layer 210 can be germanium dioxide ($GeO_2$).

In various embodiments, the oxidation layer 210 is not formed by a low temperature thermal oxidation.

Figure 7:
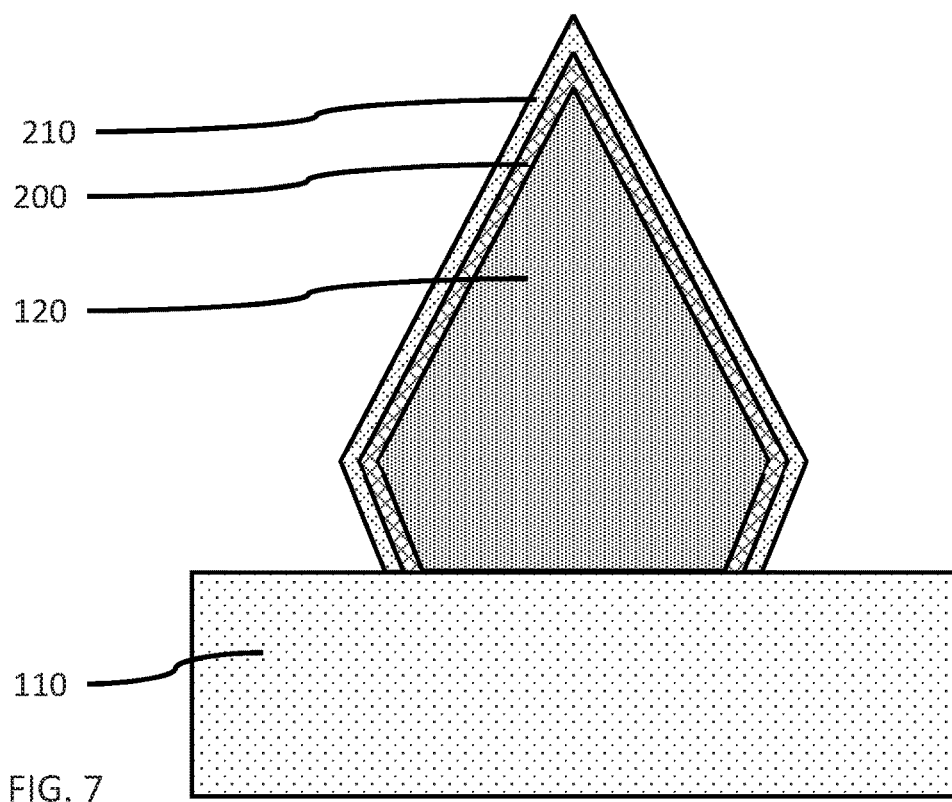
FIG. 7 is a B-B cross-sectional view of FIG. 6 showing an oxidation layer on the sacrificial layer and source/drain, in accordance with an embodiment of the present invention.

FIG. 7 is a B-B cross-sectional view of FIG. 6 showing an oxidation layer on the sacrificial layer and source/drain, in accordance with an embodiment of the present invention.

The oxidation layer 210 can have a thickness in a range of about 2 nm to about 5 nm, or about 3 nm to about 4 nm. The thickness of the oxidation layer 210 can be less than 5 nm. The thickness of the oxidation layer 210 can be less than the thickness of the sacrificial layer 200.

Figure 8:
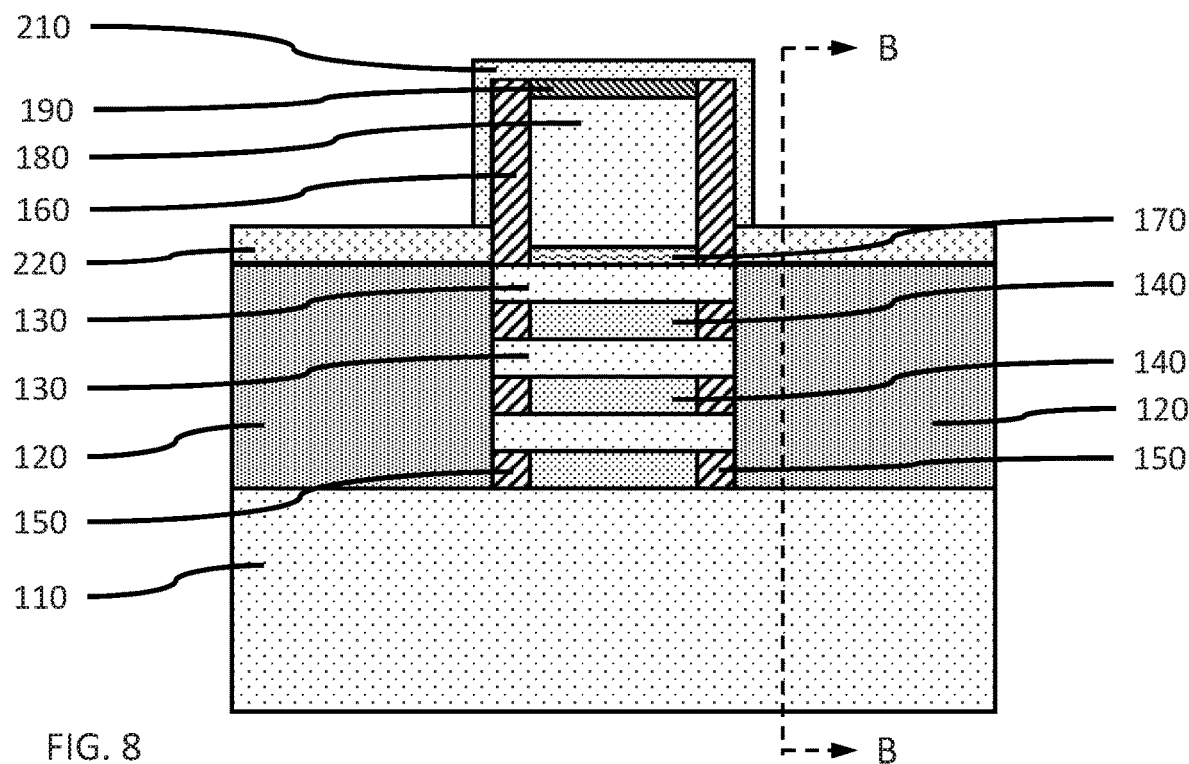
FIG. 8 is a cross-sectional side view showing a modified sacrificial layer on the source/drains, in accordance with an embodiment of the present invention.

FIG. 8 is a cross-sectional side view showing a modified sacrificial layer on the source/drains, in accordance with an embodiment of the present invention.

In various embodiments, the oxidation layer 210 and sacrificial layer 200 can be heat treated to form a modified sacrificial layer 220, where the oxidation layer 210 can chemically react with the sacrificial layer 200 to forms a volatile compound (e.g., germanium oxide (GeO)) that can vaporize, and a semiconductor oxide (e.g., silicon dioxide ($SiO_2$)) on the source/drains 120. The silicon dioxide ($SiO_2$) can be formed due to preferential oxidation of the silicon in the silicon-germanium sacrificial layer 200. The germanium of the silicon-germanium (SiGe) sacrificial layer 200 can be completely consumed in forming the $SiO_2$ modified sacrificial layer 220. In some embodiments, some germanium of the silicon-germanium (SiGe) sacrificial layer 200 may remain on the source/drains 120. The chemical reaction of the oxidation layer 210 with the sacrificial layer 200 can occur in an inert gas (e.g., $N_2$, Ar, He, and mixture thereof) atmosphere. In various embodiments, a conventional low-temperature oxidation is not used to form an $SiO_2$ layer preferentially on silicon-germanium. The heat treatment can be a spike anneal at a temperature in a range of about 400° C. to about 700° C. The heat treatment can be conducted in a 100% nitrogen ($N_2$) atmosphere.

A portion of the oxidation layer 210 can remain on the gate sidewall spacers 160 and dummy gate cap 190 of dummy gate structure, where there is no sacrificial layer 200 to react with.

Figure 9:
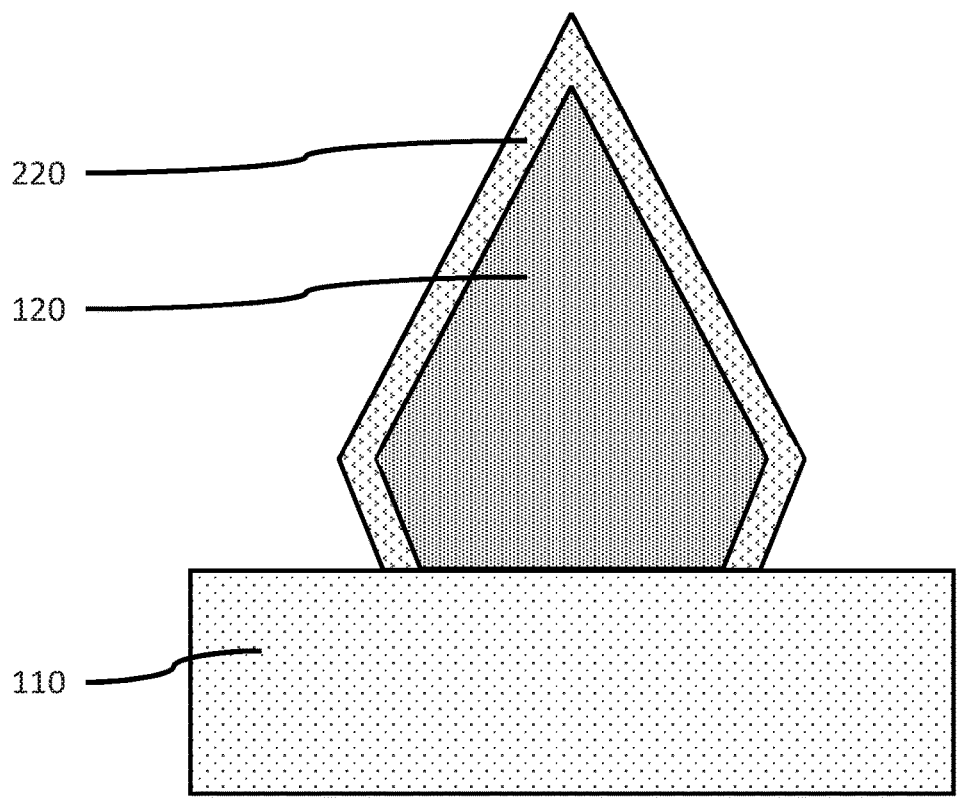
FIG. 9 is a B-B cross-sectional view of FIG. 8 showing a modified sacrificial layer on the source/drains, in accordance with an embodiment of the present invention.

FIG. 9 is a B-B cross-sectional view of FIG. 8 showing a modified sacrificial layer on the source/drains, in accordance with an embodiment of the present invention.

In various embodiments, the modified sacrificial layer 220 can have a thickness in a range of about 2 nm to about 5 nm, or about 3 nm to about 4 nm.

Figure 10:
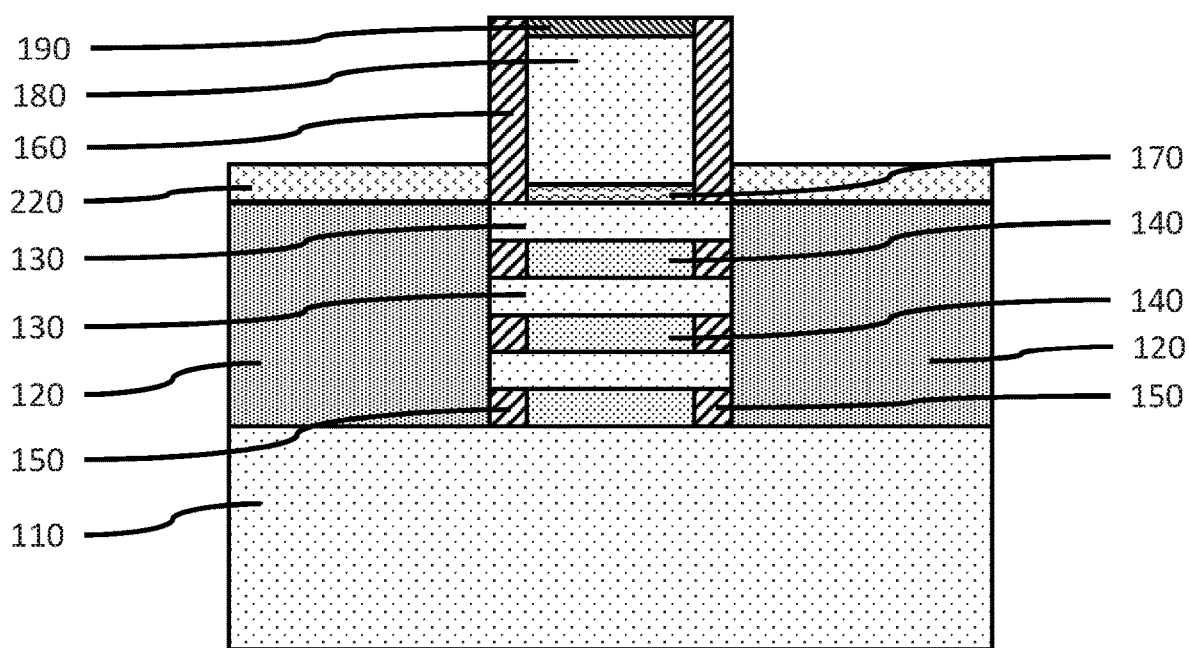
FIG. 10 is a cross-sectional side view showing the unreacted oxidation layer removed from the dummy gate structure, in accordance with an embodiment of the present invention.

FIG. 10 is a cross-sectional side view showing the unreacted oxidation layer removed from the dummy gate structure, in accordance with an embodiment of the present invention.

The modified sacrificial layer 220 can remain on the source/drains 120, while the remaining oxidation layer 210 is removed. The oxidation layer 210 remaining on the gate sidewall spacers 160 and dummy gate cap 190 of dummy gate structure can be removed with a selective etch (e.g., wet chemical etch) to expose the modified sacrificial layer 220, gate sidewall spacers 160 and dummy gate cap 190.

Figure 11:
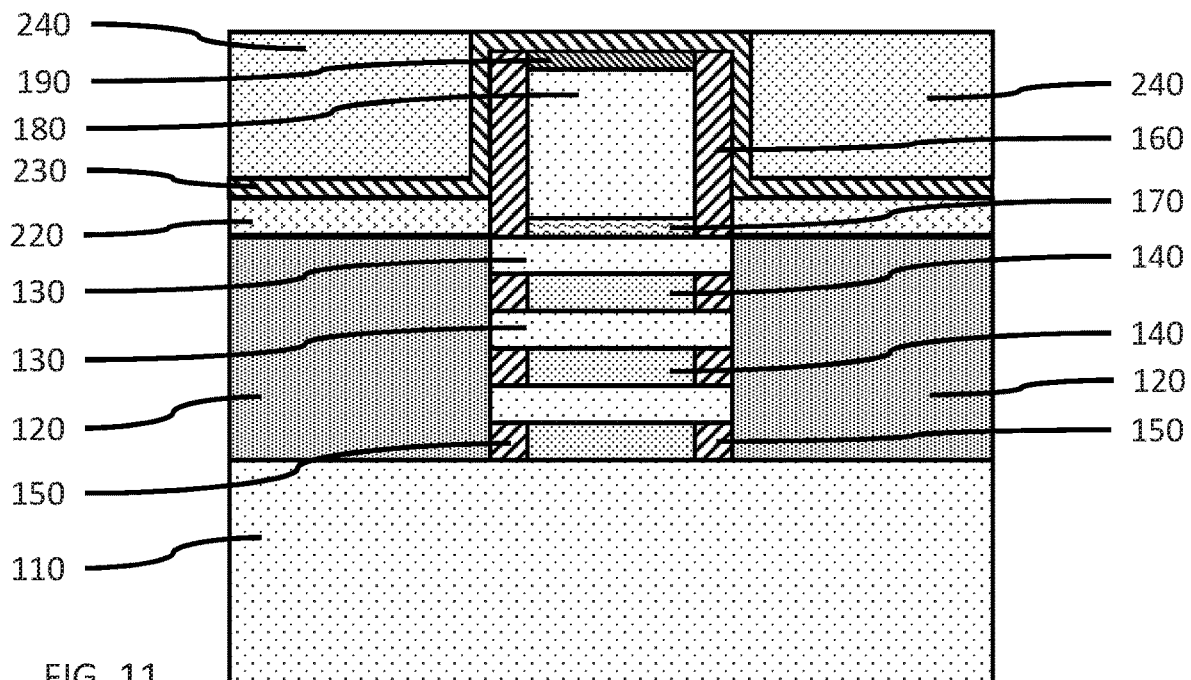
FIG. 11 is a cross-sectional side view showing a protective liner and interlayer dielectric layer on the modified sacrificial layer and the dummy gate structure, in accordance with an embodiment of the present invention.

FIG. 11 is a cross-sectional side view showing a protective liner and interlayer dielectric layer on the modified sacrificial layer and the dummy gate structure, in accordance with an embodiment of the present invention.

In various embodiments, a protective liner 230 can be formed on the modified sacrificial layer 220 and exposed surface of the substrate 110, where the protective liner 230 can be formed, for example, by ALD, PEALD, CVD, PECVD, or combinations thereof. The protective liner 230 can be a dielectric material, for example SiN, SiCN, etc., where the protective liner 230 can be a different material from the modified sacrificial layer 220, so the modified sacrificial layer 220 can be selectively removed. The protective liner 230 can be the same material as the gate sidewall spacers 160 and dummy gate cap 190, to allow etching at the same time.

An interlayer dielectric (ILD) layer 240 can be formed on the protective liner 230, where the ILD layer 240 can be formed by a blanket deposition, for example, CVD, PECVD, or spin on. The ILD layer 240 can be a dielectric material, for example silicon dioxide ($SiO_2$) or a low-K dielectric (e.g., carbon-doped silicon oxide (SiO:C). An upper portion of the ILD layer can be removed using CMP to provide a smooth, flat surface. A portion of the protective liner 230 can be exposed by removal of a portion of the ILD layer 240.

Figure 12:
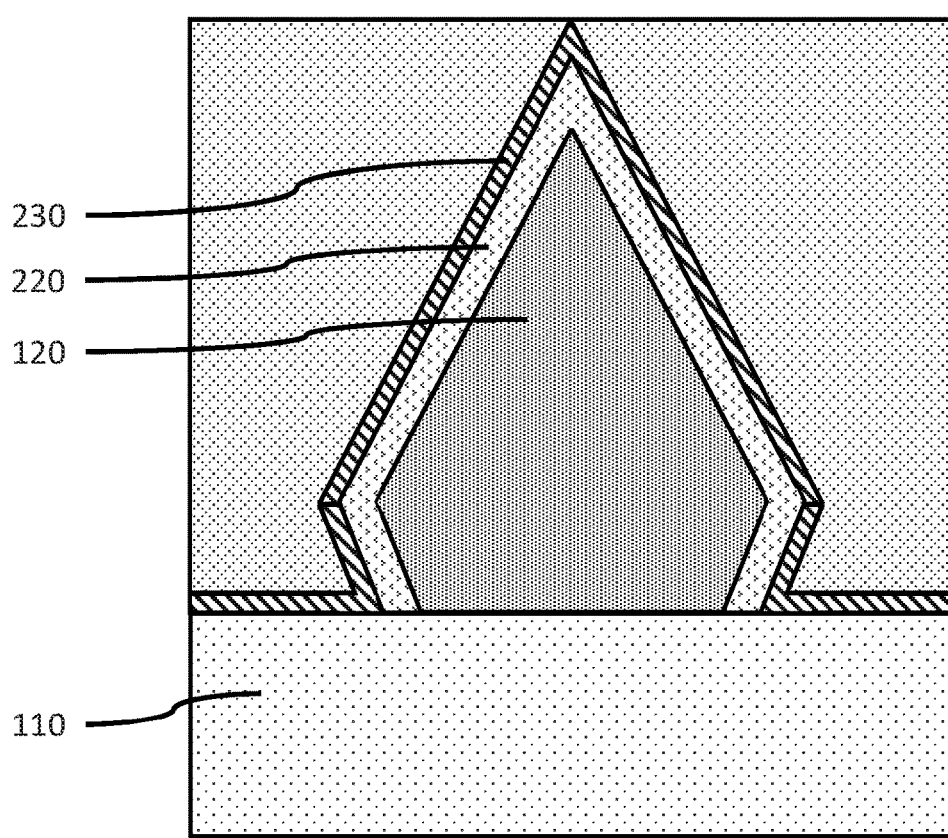
FIG. 12 is a cross-sectional end view showing the protective liner on the modified sacrificial layer on the source/drain, in accordance with an embodiment of the present invention.

FIG. 12 is a cross-sectional end view showing the protective liner on the modified sacrificial layer on the source/drain, in accordance with an embodiment of the present invention.

In various embodiments, the protective liner 230 can have a thickness in a range of about 2 nm to about 5 nm, or about 3 nm to about 4 nm.

Figure 13:
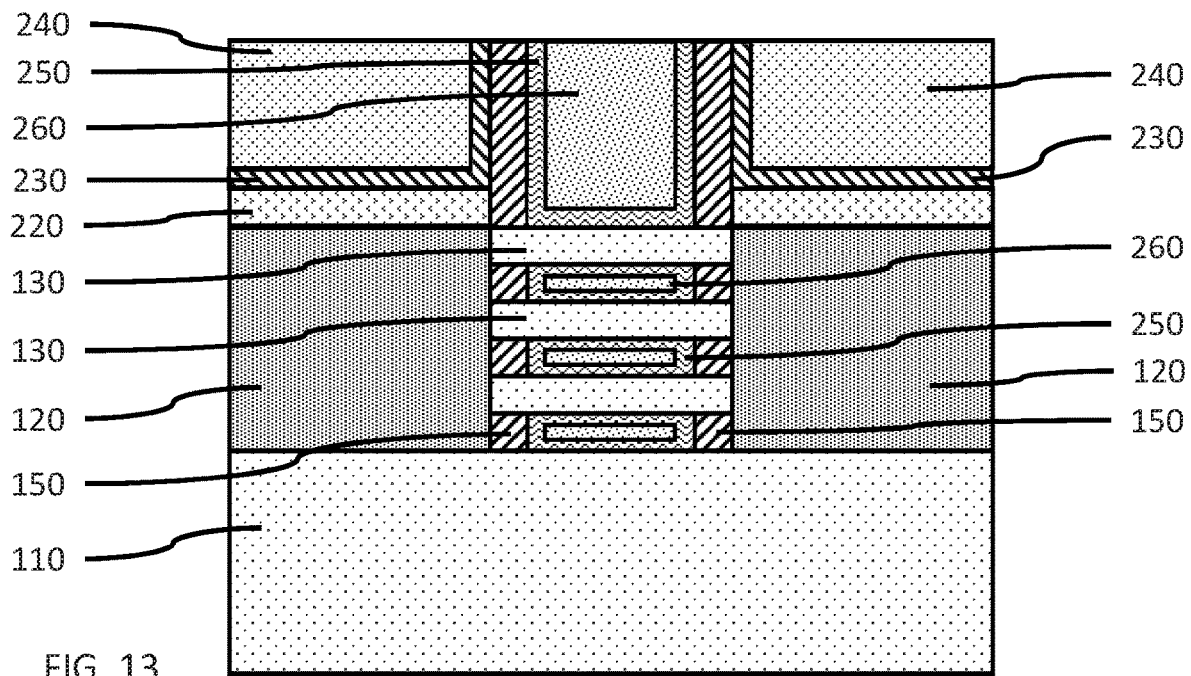
FIG. 13 is a cross-sectional side view showing the dummy gate structure and spacer layers replaced with a functional gate structure, in accordance with an embodiment of the present invention.

FIG. 13 is a cross-sectional side view showing the dummy gate structure and spacer layers replaced with a functional gate structure, in accordance with an embodiment of the present invention.

In various embodiments, the dummy gate fill layer 180 and dummy gate insulator layer 170 of the dummy gate structure and the spacer layers 140 can be removed by removing the protective liner 230 using chemical-mechanical polishing, and selectively etching the dummy gate cap 190, dummy gate fill layer 180, and dummy gate insulator layer 170 to expose a top surface of the top channel layer 130. The spacer layers 140 can be removed using a selective isotropic etch, for example, a wet chemical etch.

A gate dielectric layer 250 can be formed on the inner sidewalls of the gate sidewall spacers 160, and the top surface of the top channel layer 130, and the surfaces of the channel layers 130 exposed by removing spacer layers 140, where the gate dielectric layer 250 can be formed by a conformal deposition (e.g., ALD, PEALD).

The gate dielectric layer 250 can be a dielectric material, including, but not limited to silicon oxide (SiO), silicon nitride (SiN), a high-k dielectric, or combinations thereof. A high-k dielectric can include metal oxides (e.g., hafnium oxide (HfO), zirconium oxide (ZrO), lanthanum oxide (LaO)).

A conductive gate fill layer 260 can be formed on the gate dielectric layer 250 in the space between the gate sidewall spacers 160, for example, by ALD, PEALD, CVD, PECVD, or a combination thereof. A CMP can be used to remove portions of the conductive gate fill layer 260 deposited on the surface of the ILD layer 240 and gate sidewall spacers 160. The conductive gate fill layer 260 and gate dielectric layer 250 can form a functional gate structure on the stack of alternating channel layers.

The conductive gate fill layer 260 can be doped polycrystalline or amorphous silicon, germanium, silicon-germanium, a metal (e.g., tungsten, titanium, tantalum, ruthenium, zirconium, cobalt, copper, aluminum, platinum, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive gate fill layer 260 may further comprise dopants that are incorporated during or after deposition.

Figure 14:
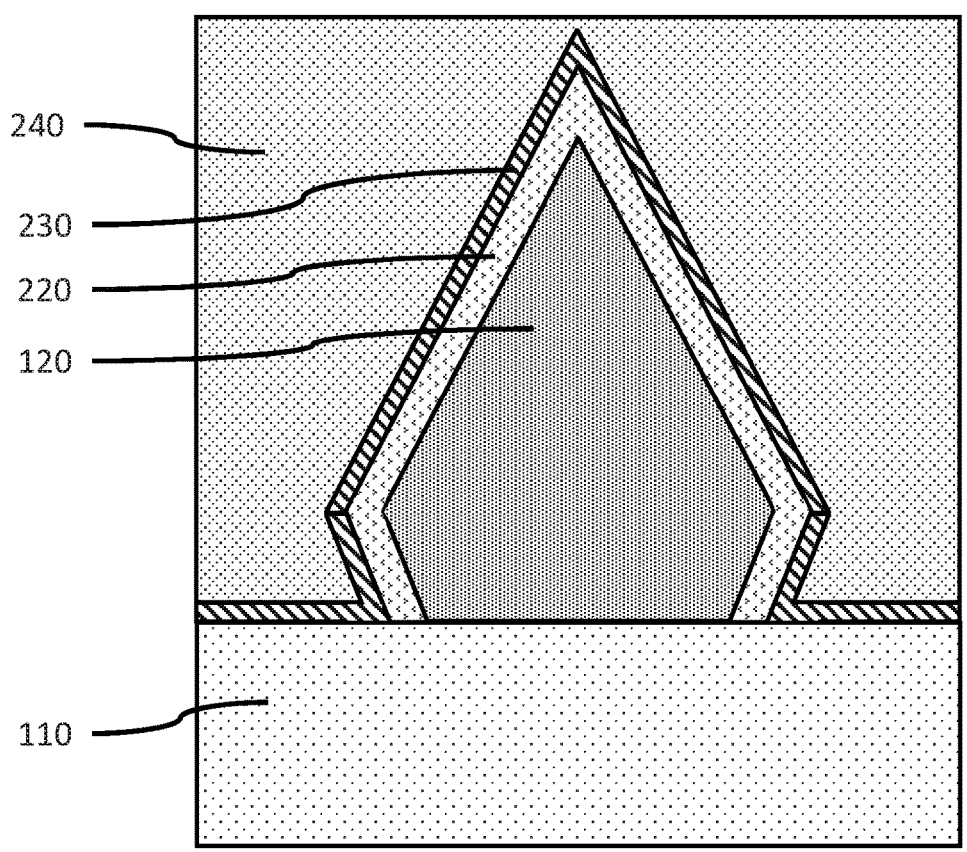
FIG. 14 is a cross-sectional end view showing a fill layer on the protective liner and the modified sacrificial layer on the source/drain, in accordance with an embodiment of the present invention.

FIG. 14 is a cross-sectional end view showing a fill layer on the protective liner and the modified sacrificial layer on the source/drain, in accordance with an embodiment of the present invention.

The ILD layer 240 can cover the protective liner 230, modified sacrificial layer 220, source/drains 120, and at least a portion of the substrate 110, while the functional gate structure is formed. The ILD layer 240 can extend above the top of the protective liner 230 on the modified sacrificial layer 220 and source/drains 120.

Figure 15:
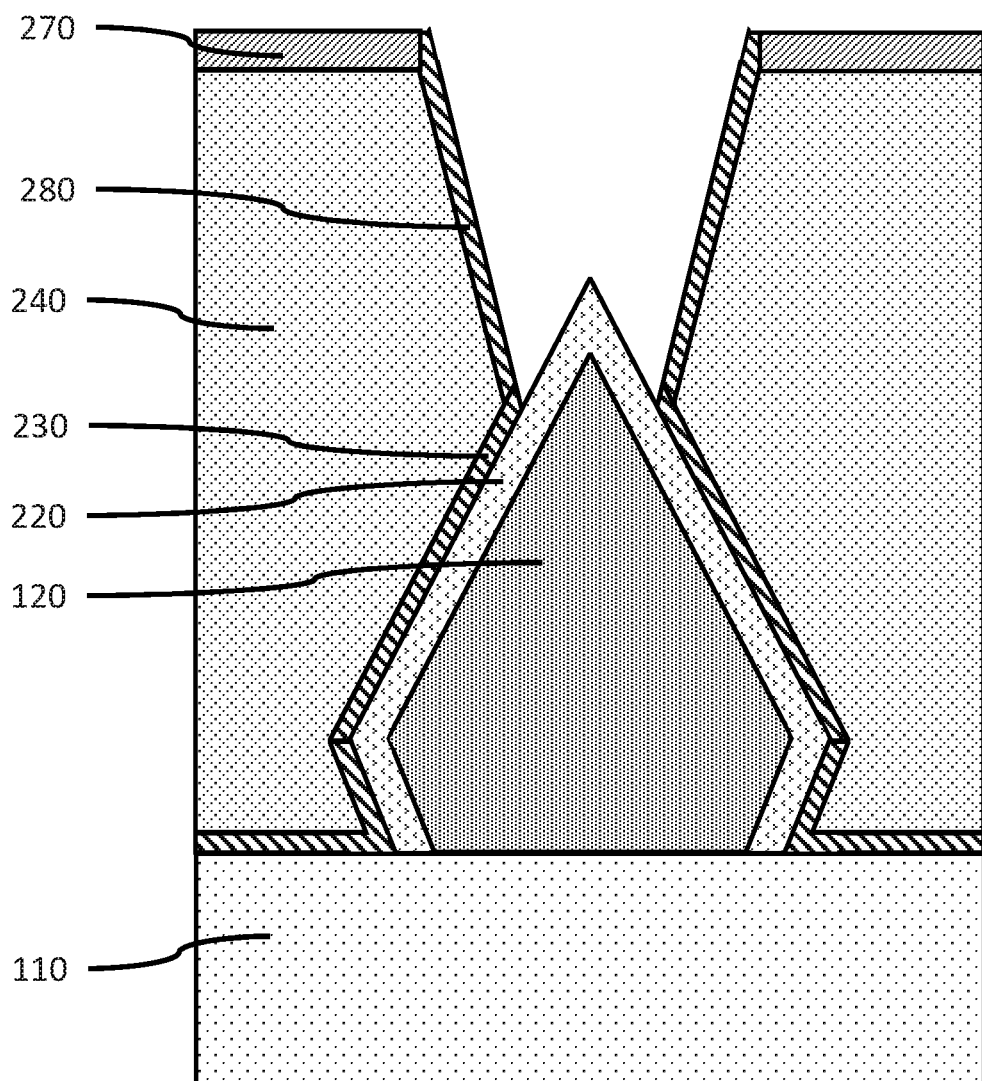
FIG. 15 is a cross-sectional end view showing the fill layer masked and etched, and a protective liner extension formed on the trench sidewalls, in accordance with an embodiment of the present invention.

FIG. 15 is a cross-sectional end view showing the fill layer masked and etched, and a protective liner extension formed on the trench sidewalls, in accordance with an embodiment of the present invention.

In various embodiments, a masking layer 270 can be formed on the ILD layer 240. The masking layer can be a resist material, and a portion of the ILD layer can be removed through patterning and development the masking layer to expose the underlying ILD layer 240 located over the protective liner 230, modified sacrificial layer 220, and source/drains 120. The exposed portion of the ILD layer 240 can be removed, for example, by a selective direction etch (e.g., reactive ion etch), where the etch can extend down to the protective liner 230. The exposed portion of the protective liner 230 can be removed using a selective isotropic etch (e.g., wet chemical etch) to expose the modified sacrificial layer 220.

A protective liner extension 280 can be formed on the sidewalls of the trench formed in the ILD layer 240, where the protective liner extension 280 can be formed by a conformal deposition. The protective liner extension 280 can be the same material as the protective liner 230, where the protective liner extension can protect the ILD layer during subsequent processes. A directional etch (e.g., RIE) can be used to remove portions of the protective liner extension 280 formed on the exposed section of the modified sacrificial layer 220, while leaving the protective liner extension 280 on the sidewalls of the trench in the ILD layer 240.

Figure 16:
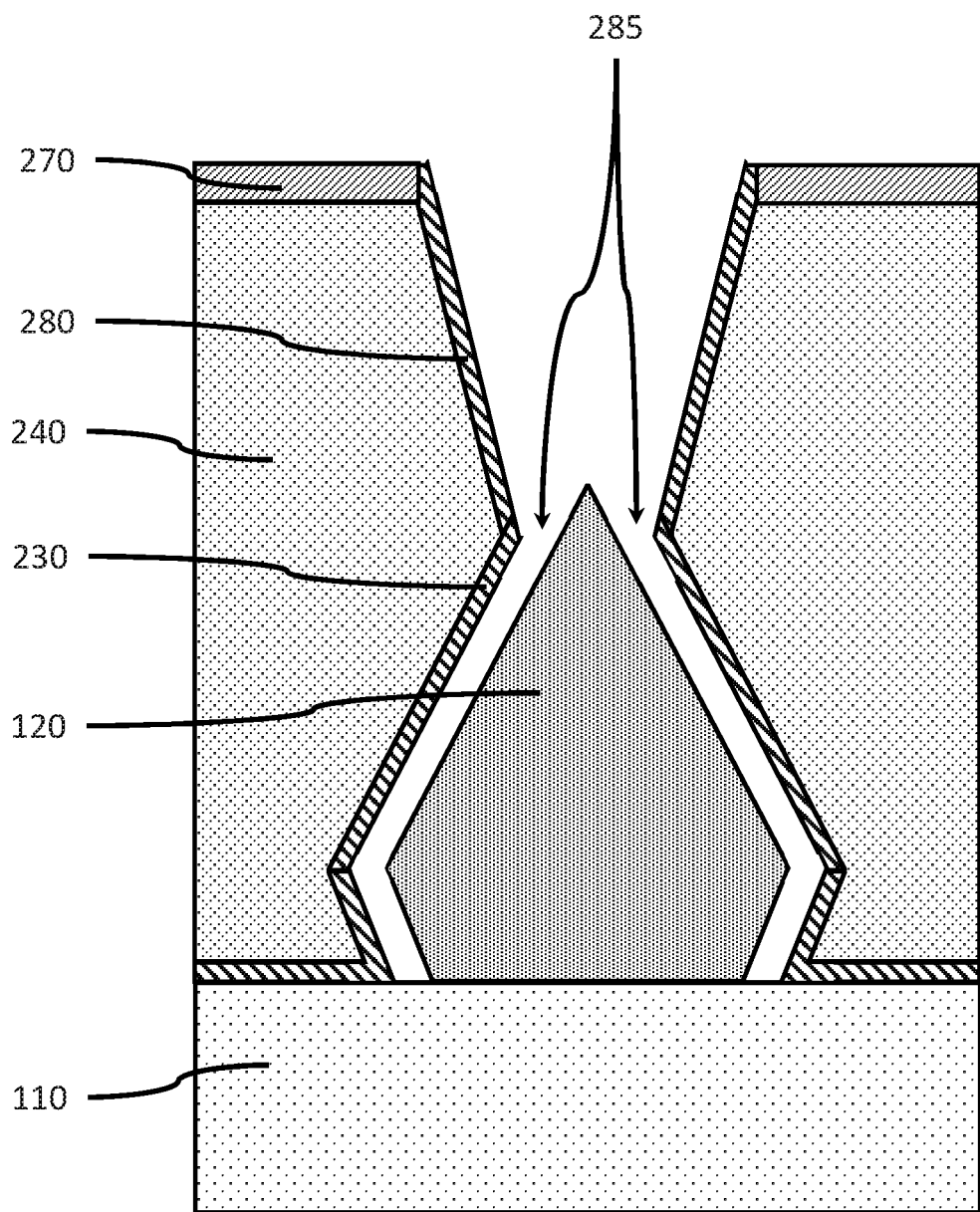
FIG. 16 is a cross-sectional end view showing the modified sacrificial layer removed from around the source/drain, in accordance with an embodiment of the present invention.

FIG. 16 is a cross-sectional end view showing the modified sacrificial layer removed from around the source/drain, in accordance with an embodiment of the present invention.

In one or more embodiments, the modified sacrificial layer 220 can be removed using a selective isotropic etch (e.g., wet chemical etch), where the protective liner 230 and protective liner extension 280 can protect the ILD Layer 240. Removal of the modified sacrificial layer 220 can form a channel 285 between the protective liner 230 and surface of the source/drains 120.

Any silicon-germanium (SiGe) remaining on the n-type silicon source/drains 120 that is exposed by removal of the modified sacrificial layer 220 can be removed using a selective isotropic etch (e.g., wet chemical etch).

Figure 17:
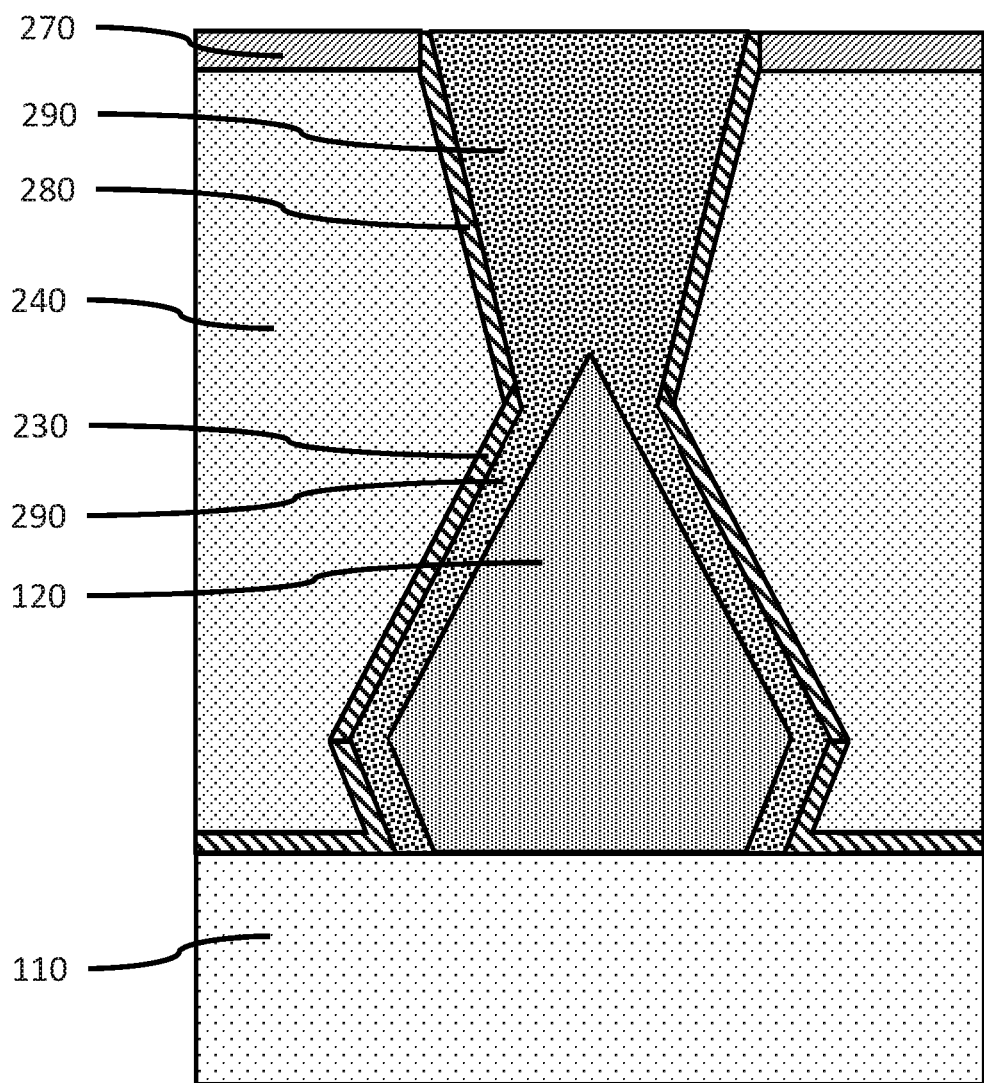
FIG. 17 is a cross-sectional end view showing a source/drain contact formed in the channel created by removing the modified sacrificial layer, in accordance with an embodiment of the present invention.

FIG. 17 is a cross-sectional end view showing a source/drain contact formed in the channel created by removing the modified sacrificial layer, in accordance with an embodiment of the present invention.

In various embodiments, a source/drain contact 290 can be formed in the channel 285. The source/drain contact 290 can be formed by depositing a conductive source/drain contact material by ALD, which can fill in a majority of the open channel area. A portion of the source/drain contact material can be reacted with the semiconductor source/drains 120 to form a silicide layer on the source/drains 120, for example, through heat treatment. Additional conductive source/drain contact material can fill in the remaining open space of the channel 285 and trench. The source/drain contact 290 can fill the trench formed in the ILD layer 240.

In various embodiments, a silicide forming layer of source/drain contact material (e.g., titanium (Ti), cobalt (Co), nickel (Ni), etc.) can be formed by ALD on the sidewalls of the channel 285, where the ALD does not form voids in the channel. The conductive source/drain contact material for the source/drain contact 290 can be formed on the silicide layer.

The source/drain contact 290 can be a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), or any suitable combination of these materials.

The thickness of the source/drain contact 290 determined by the width of the channel and thickness of the modified sacrificial layer 220.

Figure 18:
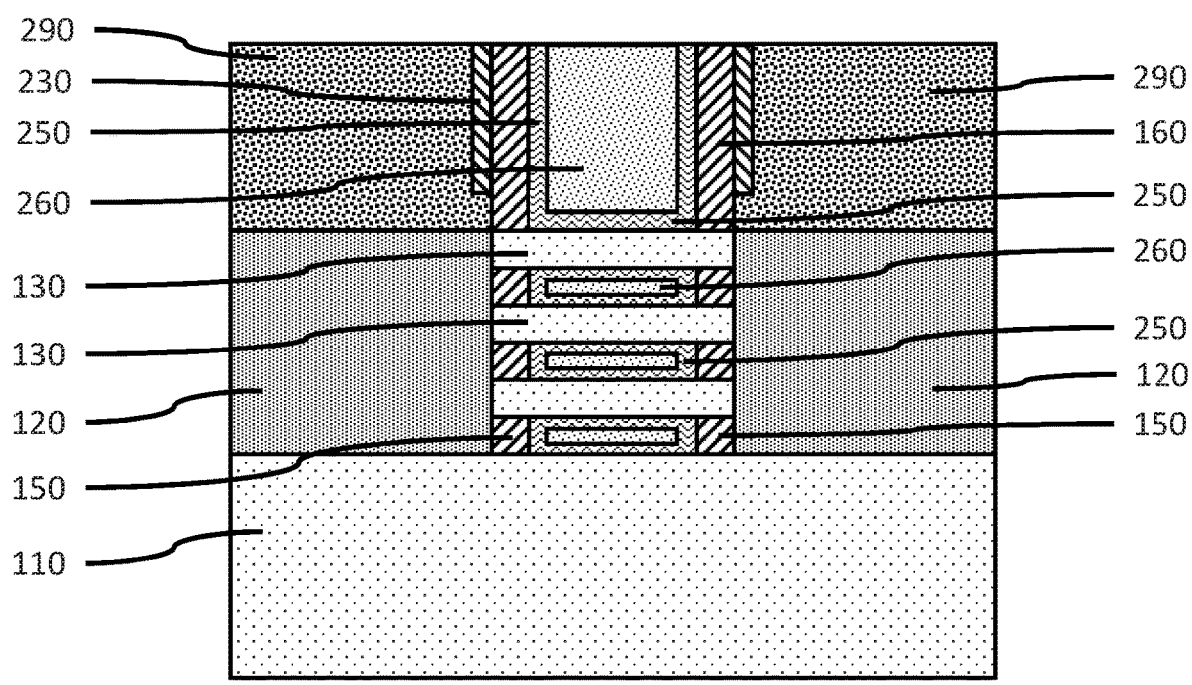
FIG. 18 is a cross-sectional side view showing the source/drain contacts on the source/drains, in accordance with an embodiment of the present invention.

FIG. 18 is a cross-sectional side view showing the source/drain contacts on the source/drains, in accordance with an embodiment of the present invention.

The source/drain contacts 290 can be on the source/drains 120 and adjacent to the portions of the protective liner 230 remaining on the gate sidewall spacers 160 and on a portion of the gate sidewall spacers 160 exposed by the removal of the modified sacrificial layer 220.

The source/drain contacts 290 can wrap around all sides of the source/drain except for the side in contact with the substrate 110.

A p-type silicon-germanium source/drain 120 can have a germanium (Ge) concentration gradient from the outer surface inwards due to selective Ge condensation during processing.

The wrap-around source/drain contacts 290 can have a contact resistivity below 3×10−9 ohm-square centimeter.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments d is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements car features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or r ore intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a source/drain contact, comprising:
    forming a modified sacrificial layer on a source/drain, wherein the modified sacrificial layer is formed from a sacrificial layer and at least one other layer through a chemical reaction;
    forming an interlayer dielectric (ILD) layer on the modified sacrificial layer;
    removing a portion of the ILD layer located over the modified sacrificial layer to form a trench; and
    removing at least a portion of the modified sacrificial layer to form a channel between the ILD layer and the source/drain that exposes at least a portion of the sidewalls of the source/drain.

2. The method of claim 1, wherein the channel exposes a portion of the substrate adjacent to the source/drain.

3. The method of claim 1, further comprising forming a source/drain contact in the channel.

4. The method of claim 3, wherein the source/drain contact is a material selected from the group consisting of a metal, a conducting metallic compound material, and combinations thereof.

5. The method of claim 4, wherein the modified sacrificial layer is silicon dioxide ($SiO_2$).

6. The method of claim 3, wherein the source/drain contact is in direct contact with a gate sidewall spacer of a gate structure.

7. The method of claim 6, wherein the source/drain contact is formed by atomic layer deposition (ALD).

8. The method of claim 7, further comprising a heat treatment to form a silicide layer on the source/drain from at least a portion of the source/drain contact.

9. The method of claim 8, wherein the source/drain contact has a contact resistivity below $3 \times 10^{-9}$ ohm-square centimeter to the source/drain.

10. The method of claim 8, wherein the source/drain contact fills the trench formed in the ILD layer.

11. A method of forming a source/drain contact, comprising:
    forming a modified sacrificial layer on a source/drain, wherein the modified sacrificial layer is formed from a sacrificial layer and at least one other layer through a chemical reaction;
    forming a protective liner on the modified sacrificial layer;
    forming an interlayer dielectric (ILD) layer on the protective liner;
    removing a portion of the ILD layer located over the modified sacrificial layer to form a trench that exposes a portion of the protective liner; and
    removing the exposed portion of the protective liner and at least a portion of the modified sacrificial layer to form a channel between the protective liner and the source/drain that exposes at least a portion of the sidewalls of the source/drain.

12. The method of claim 11, further comprising depositing a protective liner extension on the exposed sidewalls of the trench, and removing the modified sacrificial layer to form a channel.

13. The method of claim 12, further comprising forming a source/drain contact in the channel.

14. The method of claim 13, wherein the source/drain contact is formed of a material selected from the group consisting of titanium (Ti), cobalt (Co), and nickel (Ni).

15. The method of claim 14, wherein the modified sacrificial layer has a thickness in a range of about 2 nm to about 5 nm.

16. The method of claim 14, wherein the protective liner has a thickness in a range of about 2 nm to about 5 nm.

17. A method of forming a source/drain contact, comprising:
    forming a modified sacrificial layer on a source/drain, wherein the modified sacrificial layer is silicon dioxide ($SiO_2$);
    forming a protective liner on the modified sacrificial layer, wherein the protective liner is made of a material selected from the group consisting of silicon nitride (SiN) and silicon carbonitride (SiCN);
    forming an interlayer dielectric (ILD) layer on the protective liner;
    removing a portion of the ILD layer located over the modified sacrificial layer to form a trench that exposes a portion of the protective liner; and
    removing the exposed portion of the protective liner and at least a portion of the modified sacrificial layer to form a channel between the protective liner and the source/drain that exposes at least a portion of the sidewalls of the source/drain.

18. The method of claim 17, further comprising forming a source/drain contact in the channel.

19. The method of claim 18, wherein the source/drain contact is formed of a material selected from the group consisting of titanium (Ti), cobalt (Co), and nickel (Ni).

20. The method of claim 18, wherein a portion of the source/drain contact in physical contact with the source/drain has a thickness in a range of about 2 nm to about 4 nm.

* * * * *